(12) United States Patent
Matsuki

(10) Patent No.: US 7,626,428 B2
(45) Date of Patent: Dec. 1, 2009

(54) BUFFER CIRCUIT WITH REDUCED POWER CONSUMPTION

(75) Inventor: Fumirou Matsuki, Tokyo (JP)

(73) Assignee: TPO Hong Kong Holding Limited, Shatin (HK)

( * ) Notice: Subject to any disclaimer, the term of this patent is extended or adjusted under 35 U.S.C. 154(b) by 124 days.

(21) Appl. No.: 11/921,823

(22) PCT Filed: Jun. 8, 2006

(86) PCT No.: PCT/JP2006/311511

§ 371 (c)(1),
(2), (4) Date: Dec. 7, 2007

(87) PCT Pub. No.: WO2006/132315

PCT Pub. Date: Dec. 14, 2006

(65) Prior Publication Data

US 2009/0115463 A1 May 7, 2009

(30) Foreign Application Priority Data

Jun. 10, 2005 (JP) .............................. 2005-171554

(51) Int. Cl.
*H03K 3/00* (2006.01)
(52) U.S. Cl. ........................... 327/108; 327/112; 326/83
(58) Field of Classification Search ................. 327/108, 327/112; 326/82, 83
See application file for complete search history.

(56) References Cited

U.S. PATENT DOCUMENTS

| 5,610,533 A | 3/1997 | Arimoto et al. |
| 5,703,522 A | 12/1997 | Arimoto et al. |
| 5,854,561 A | 12/1998 | Arimoto et al. |
| 6,232,793 B1 | 5/2001 | Arimoto et al. |
| 6,600,483 B1 * | 7/2003 | Akita et al. .................. 345/204 |
| 7,414,453 B2 * | 8/2008 | Tachibana et al. ........... 327/333 |

FOREIGN PATENT DOCUMENTS

| JP | 8-017183 | 1/1996 |
| JP | 2001-244761 | 9/2001 |
| KR | 0169157 | 2/1999 |

OTHER PUBLICATIONS

PCT International Search Report of Counterpart PCT Application No. PCT/JP2006/311511.
Moon, et al., "2-inch qVGA SOG-LCD employing TS-SLS", Digest of Technical Papers, AM-LCD04, 2004, Active Matrix Liquid Crystal Display Device Workshop, Aug. 25-27, 2004.

* cited by examiner

*Primary Examiner*—Kenneth B. Wells
(74) *Attorney, Agent, or Firm*—Liu & Liu

(57) ABSTRACT

A buffer circuit is provided, having an odd number of stages of inverting amplifiers, wherein the stages are capacitive coupled. A negative feedback path feeds back from an output terminal of the final stage of the inverting amplifiers to an input terminal of the initial stage. A reference current source is also provided. A first switch is provided between the adjacent stages of the inverting amplifiers and switched, depending upon a mode of operation. A second switch is provided for selectively driving at least a transistor(s) in the final stage to cause a current mirror circuit with the reference current source depending upon a mode of operation.

6 Claims, 8 Drawing Sheets

BUFFER CIRCUIT WITH REDUCED POWER CONSUMPTION

BACKGROUND OF THE INVENTION

1. Field of the Invention

The invention relates to a buffer circuit, and more particularly, relates to an analog output buffer of a D-A converter (digital-to-analog converter). The invention is suitable to an output buffer used in a liquid crystal display device, and especially, suitable to an output buffer made on a glass substrate of the liquid crystal display device through the same process for LCDs using the low temperature polysilicon (LTPS) technology.

2. Description of the Prior Art

A conventional analog buffer circuit, connected to an output terminal of a D-A converter, has a well known arrangement comprising a three-stage inverter amplifier (inverting amplifier) built up by means of capacitive coupling and negative feedback path, as shown in a circuit diagram in FIG. 7.

Throughout the accompanying drawings, a gate terminal accompanied with a small circle represents a P channel MOS transistor.

The analog buffer circuit comprises a first inverter having a P channel MOS (PMOS) transistor PT1 and an N channel MOS (NMOS) transistor NT1 connected in series between a supply voltage $V_{DD}$ and a ground $V_{SS}$, a second inverter similarly having PMOS transistor PT2 and NMOS transistor NT2 connected in series, and a third inverter having PMOS transistor PT3 and NMOS transistor NT3 connected in series. A common gate node of the transistors PT1 and NT1 is connected to an input terminal via a capacitor C1, and a first switch SW1 is provided between a connection node NI of the transistors PT1/NT1 and their common gate node.

Similarly, a capacitor C3 is connected between the connection node N1 and the common gate node of the transistors PT2 and NT2. A second switch SW2 is provided between the common gate node of the transistors PT2/NT2 and a connection node N2 of the transistors PT2 and NT2.

In addition, a capacitor C4 is connected between the connection node N2 and a common gate node of the transistors PT3 and NT3. A third switch SW3 is provided between the common gate node of the transistors PT3/NT3 and a connection node N3 of the transistors PT3 and NT3. The connection node N3 serves as an output node $V_{OUT}$.

A terminal opposing the input terminal of the capacitor C1 is coupled to the connection node N3 via the capacitor C2 and a fourth switch SW4 to form a negative feedback path, and a reference voltage $V_{ref}$ is applied to a connection node of the capacitor C2 and the switch SW4 via a switch SW5.

Thus, this analogue buffer circuit is configured such that three stages of inverters are coupled through a capacitive element and a negative feedback path.

An operation of this circuit will now be described.

First, in a standby mode (referred to also as "setup mode") where the initializing and the standby operation are carried out, the switches SW1, SW2, SW3 and SW5 are turned on, and the switch SW4 is turned off. This permits the reference voltage $V_{ref}$ to be applied to charge the capacitors C2, C3 and C4.

Next, in an active mode where the circuit serves as a buffer, the switches SW1, SW2, SW3 and SW5 are turned off, and the switch SW4 is turned on. Thereby, the transistors are driven in response to the input voltage $V_{IN}$ to transfer an inverted signal from one inverter stage to another and resultantly produce an inverted output to the output terminal $V_{OUT}$.

FIG. 8 is a circuit diagram showing another example of conventional analog buffer circuit. As mentioned later, this circuit is disclosed in Non-Patent Document 1 listed below.

The buffer circuit comprises roughly three main components.

First, the first main component is a current source circuit having four transistors PT11, PT12, NT12 and NT11 connected in series between a supply voltage $V_{DD}$ and a ground $V_{SS}$. Gate and drain of the transistor PT11 are connected together and source of the transistor PT11 is connected to the supply voltage $V_{DD}$. Source, gate and drain of the transistor PT12 are respectively connected to the drain of the transistor PT11, the ground $V_{SS}$ and drain of the transistor NT12. Gate and source of the transistor NT12 are respectively connected the supply voltage $V_{DD}$ and drain of the transistor NT11. Source and gate of the transistor NT11 are respectively connected to the ground $V_{SS}$ and the drain of the transistor NT11.

The current source circuit generates current I1.

Next, the second main component is an operational amplifier (OP amp). The operational amplifier comprises first and second amplifiers. In the first amplifier, gate and source of a bias transistor PT21 are respectively connected to the transistor PT11 of the current source circuit and the supply voltage $V_{DD}$. Drain of the bias transistor PT21 is connected to sources of two differential transistors PT22 and PT23. Drains of the transistors PT22 and PT23 are respectively connected to drains of transistors NT21 and NT22, wherein the gates are commonly connected. Any of the transistors NT21 and NT22 may have a grounded source, and function as a load transistor.

The second amplifier is configured symmetrical to the first amplifier described above.

In the second amplifier, the drain of the bias transistor NT33 is connected to sources of two differential transistors NT31 and NT32. Drains of the transistors NT31 and NT32 are respectively connected to drains of two load transistors PT31 and PT32, wherein the gates are commonly connected. Any of the load transistors PT31 and PT32 may have a connected source to the supply voltage $V_{DD}$.

Input voltage $V_{IN}$ is applied to the gates of the transistors PT23 and NT31. In addition, the remaining transistors of the pairs of the differential transistors, namely, the transistors PT22 and NT32, have respective gates connected to a connection node N10 or an output terminal $V_{OUT}$.

The third main component comprises a P channel transistor PT41, wherein the drain and source are respectively connected to the connection node N10 and the supply voltage $V_{DD}$, and an N channel transistor NT41, wherein the drain and source are respectively connected to the connection node N10 and the ground $V_{SS}$, whereby together, the transistors form an inverting circuit. The output from the right hand side amplifier is connected to a gate of the transistor PT41 while the output from the left hand side amplifier is connected to the gate of the transistor NT41.

In this circuit, the operational amplifier is stably driven using the current source, and hence, any single stage of the inverting circuits can produce a stable buffer output.

LIST OF REFERENCES

Non-Patent Document 1

"2-Inch qVGA SOG-LCD employing TS-SLS" by Kook Chul Moon et al., Digest of Technical Papers, AM-LCD04, 2004, Active Matrix Liquid Crystal Display Device Workshop, Aug. 25-27, 2004.

However, when forming transistors of different withstanding voltages and thicknesses, gate insulating films of transistors must be different. Transistors of different gate insulating films cannot be formed by the aforementioned fabricating process, thus, a different processes is required for fabricating such transistors.

BRIEF SUMMARY OF INVENTION

Problems to be Solved

Depending upon fabricating process, the conventional configuration of the buffer circuit may encounter a problem of having large power consumption. Namely, current flows in the circuit in standby mode as well as in active mode, and consequently, as a whole, may increase the power consumption of the circuit.

In the case where the circuit components are fabricated by low temperature polysilicon (LTPS) process, variation of transistor characteristics (such as turn-on resistance) may result from the manufacturing process, and thus result in increasing of power consumption. Such unevenness (or dispersion) of the power consumption is conspicuous in the circuit of four transistors connected in series as shown in FIG. 8. In addition, the uneven power consumption results from the transistor characteristics regardless of the stability and supply capability of external reference current sources, thus hindering control and adjustments. The conventional art described in conjunction with FIG. 7 also encounters the similar issue.

Accordingly, it is an object of the invention to provide an analog buffer circuit capable of avoiding the unevenness of power consumption due to the varied turn-on resistances of transistors resulting from the manufacturing process and also obtaining high driving ability.

Means For Solving Problem

A buffer circuit according to the invention, comprises: odd-numbered inverting amplifying stages, wherein the stages are capacitive coupled; a negative feedback path feeding back from an output terminal of a final stage of the inverting amplifying stages to an input terminal of an initial stage of the inverting amplifying stages; at least a reference current source; a first switch provided between any two adjacent stages of the inverting amplifying stages and switched depending upon a mode of operation; and a second switch connecting the reference current source to at least a transistor in the final stage to selectively configure a current mirror circuit, depending upon a mode of operation.

Effects of the Invention

The invention provides an analog buffer circuit having first and second switches to shift between a standby mode and an active mode, and since constant current is applied from current mirror transistors coupled to a reference constant current source in the standby mode, power consumption in the analog buffer circuit can be reduced, with stable reference current source, despite significant process-depending unevenness occurring.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Several embodiments of the present invention will now be described with reference to the accompanying drawings.

Embodiment 1

Figure 1:
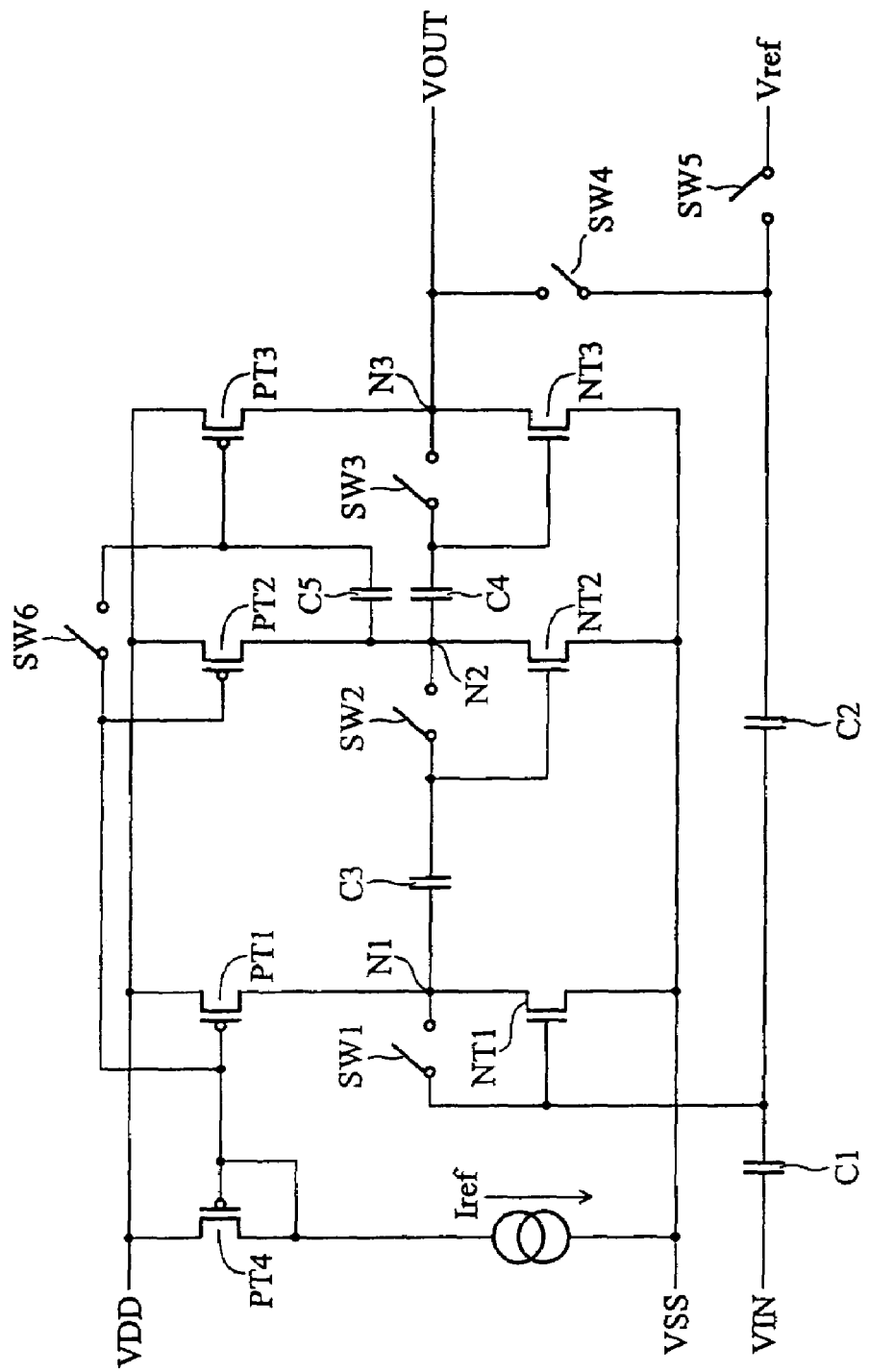
FIG. 1 is a circuit diagram showing an embodiment of an analog buffer circuit according to the present invention.
Figure 7:
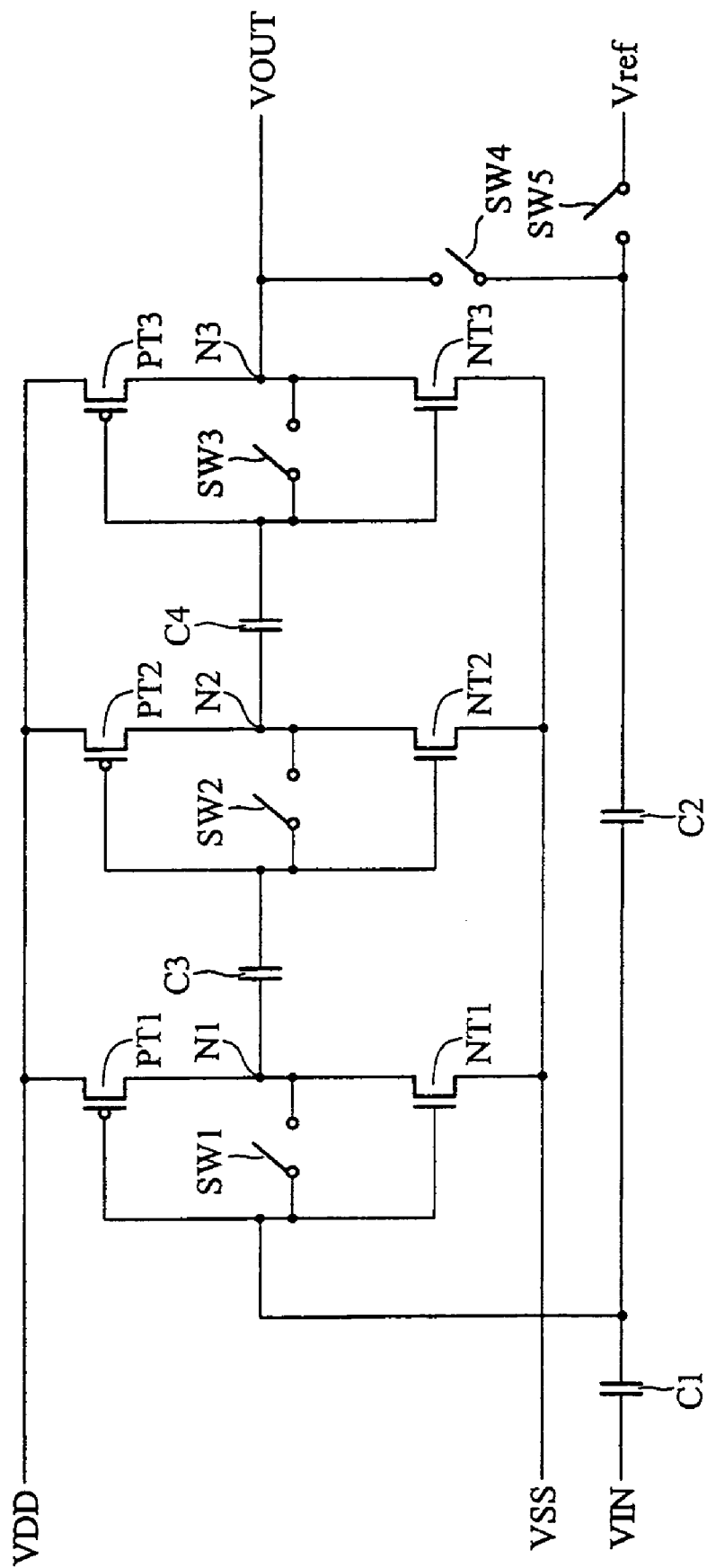
FIG. 7 is a circuit diagram showing a typical analog buffer circuit conventionally used.

FIG. 1 is a circuit diagram showing an embodiment of an analog buffer circuit according to the invention, and this embodiment is a modified configuration of FIG. 7. Thus, same reference numerals denote similar components throughout the drawings, and detailed descriptions of such components will be omitted.

In this embodiment, a reference current source comprising a P channel transistor PT4 for applying constant current $I_{ref}$ is added, and P channel transistors PT1 and PT2 of inverters (in successive stages) have their respective gates connected to a gate of the transistor PT4 of the reference current source, whereby a current mirror is configured. As a consequence, transistors NT1, NT2 and NT3 incorporated herein are source-grounded inverting amplifiers instead of conventional complimentary type inverters. Moreover, a gate of a transistor PT3 is connected to a gate of the transistor PT4 of the reference current source via a switch SW6, and the transistor PT3 similarly functions as a current mirror transistor when the switch SW6 turns on. Unlike the conventional art, the gate of the transistor PT3 is connected to a drain of the transistor PT2 (or a connection node N2) via a capacitor C5 (in FIG. 1) rather than to the connection node N3 of the capacitor C4 and the switch SW3 (in FIG. 7).

An operation of the circuit will be described below.

In a standby mode, the switches SW1, SW2, SW3, SW5 and SW6 are turned on, and the switch SW4 is turned off.

In this method, the transistors PT1, PT2 and PT3 in upper portions of the inverters operate as current mirror circuits where a low amount of current flows, and the reference voltage source $V_{ref}$ charges up a capacitor C2. For active mode, the switches SW1, SW2, SW3, SW5 and SW6 are turned off, and the switch SW4 is turned on, and an input signal $V_{IN}$ is inverted through the inverters and a feedback loop of capacitors C1 and C2 to produce an output signal $V_{OUT}$.

During operation, the transistor PT3, namely, the current mirror in the final stage of the inverters also serves as an amplifier which is capable of enhancing driving ability.

Figure 2:
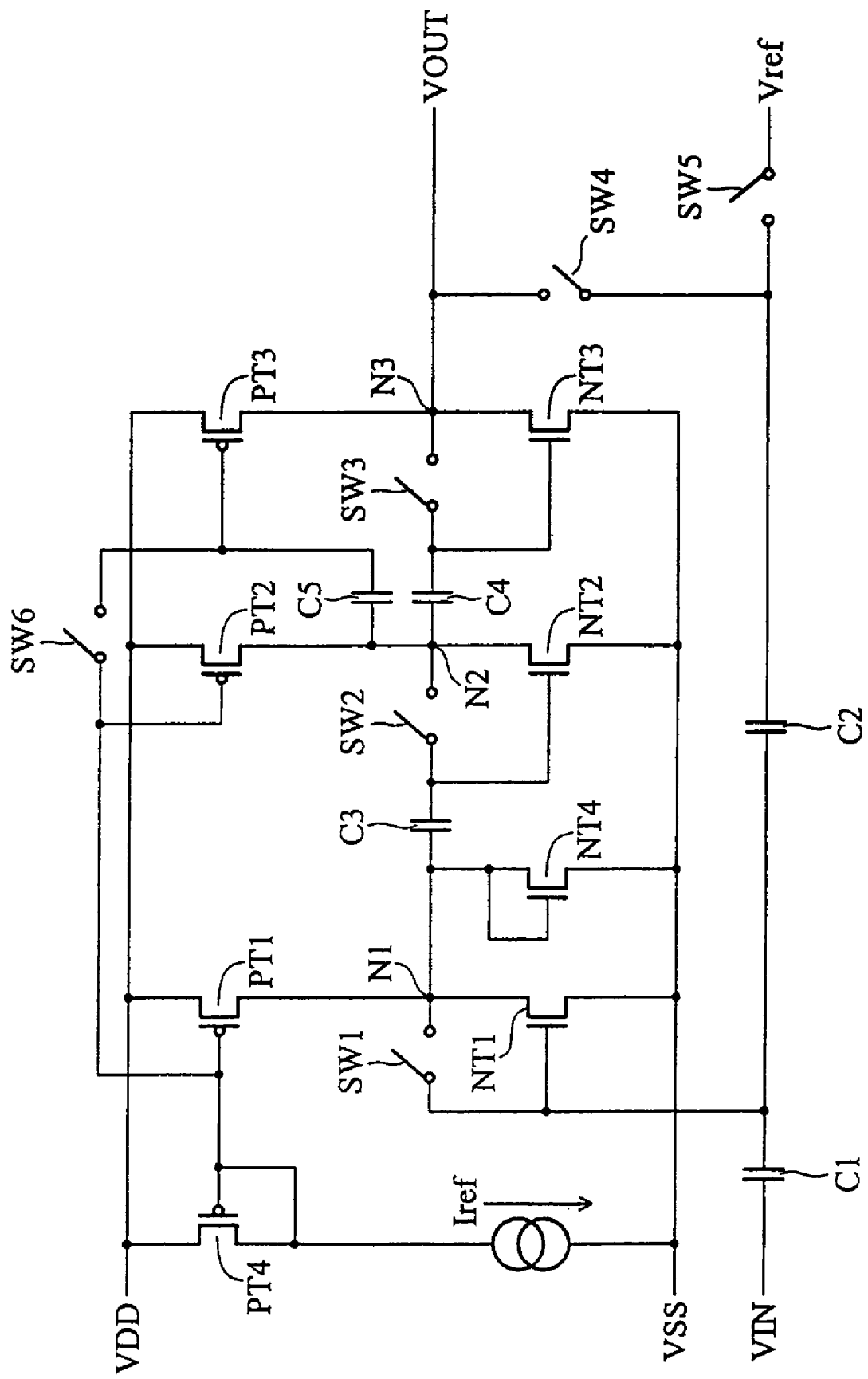
FIG. 2 is a circuit diagram showing a variation of the analog buffer circuit according to the present invention.

FIG. 2 is a variation of the analog buffer circuit described in conjunction with FIG. 1, and this circuit is additionally provided with an N channel transistor NT4, having its gate and drain connected together, between a connection node N1 and a ground $V_{SS}$.

The transistor NT4 is an operation guaranteeing transistor which is turned on in response to a slight increase in potential at its drain to help the inverting amplifier of the first stage assuredly work as expected.

Figure 3:
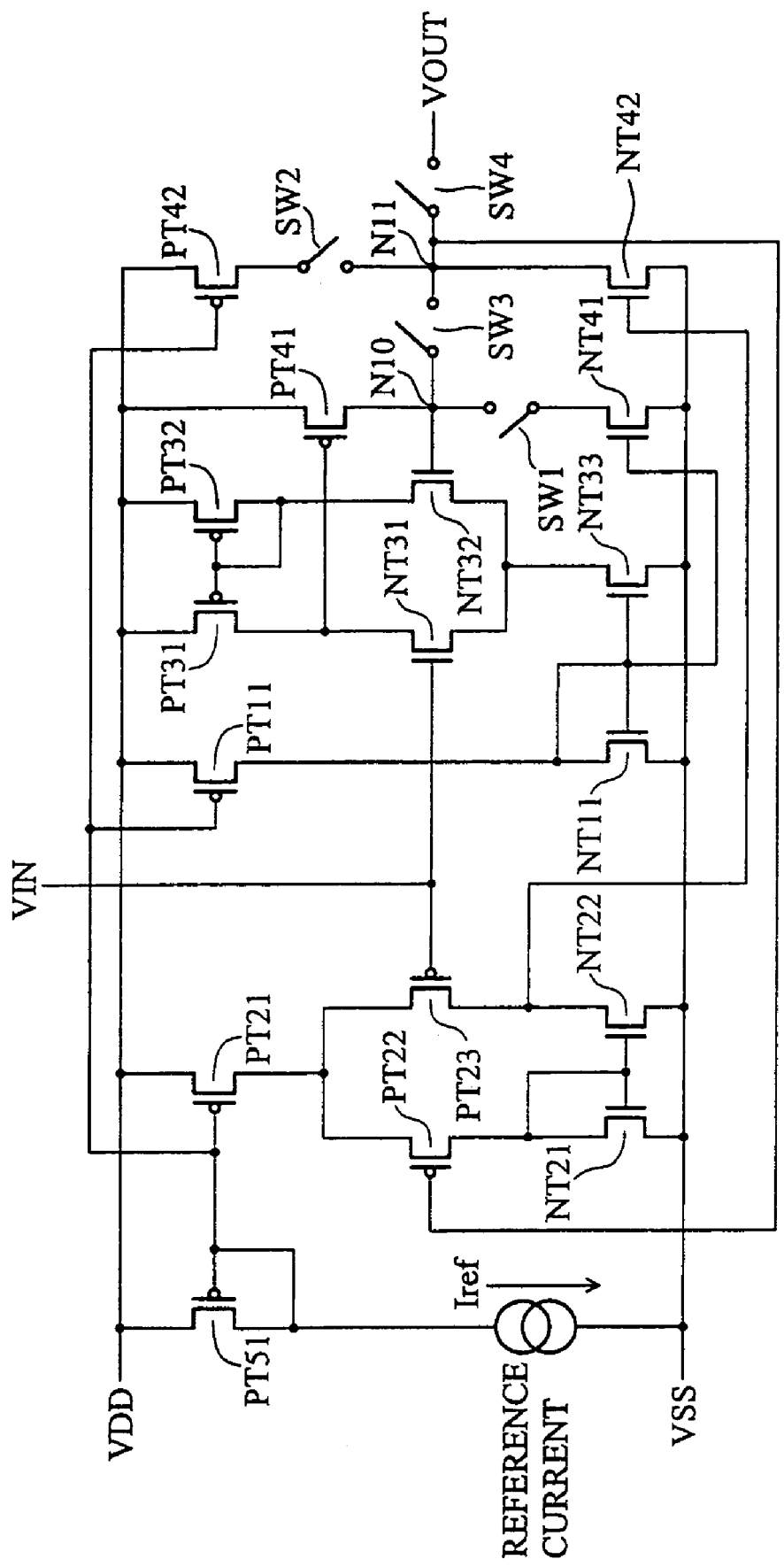
FIG. 3 is a circuit diagram illustrating an embodiment of the present invention to which the prior art analog buffer circuit as in FIG. 8 is incorporated.
Figure 8:
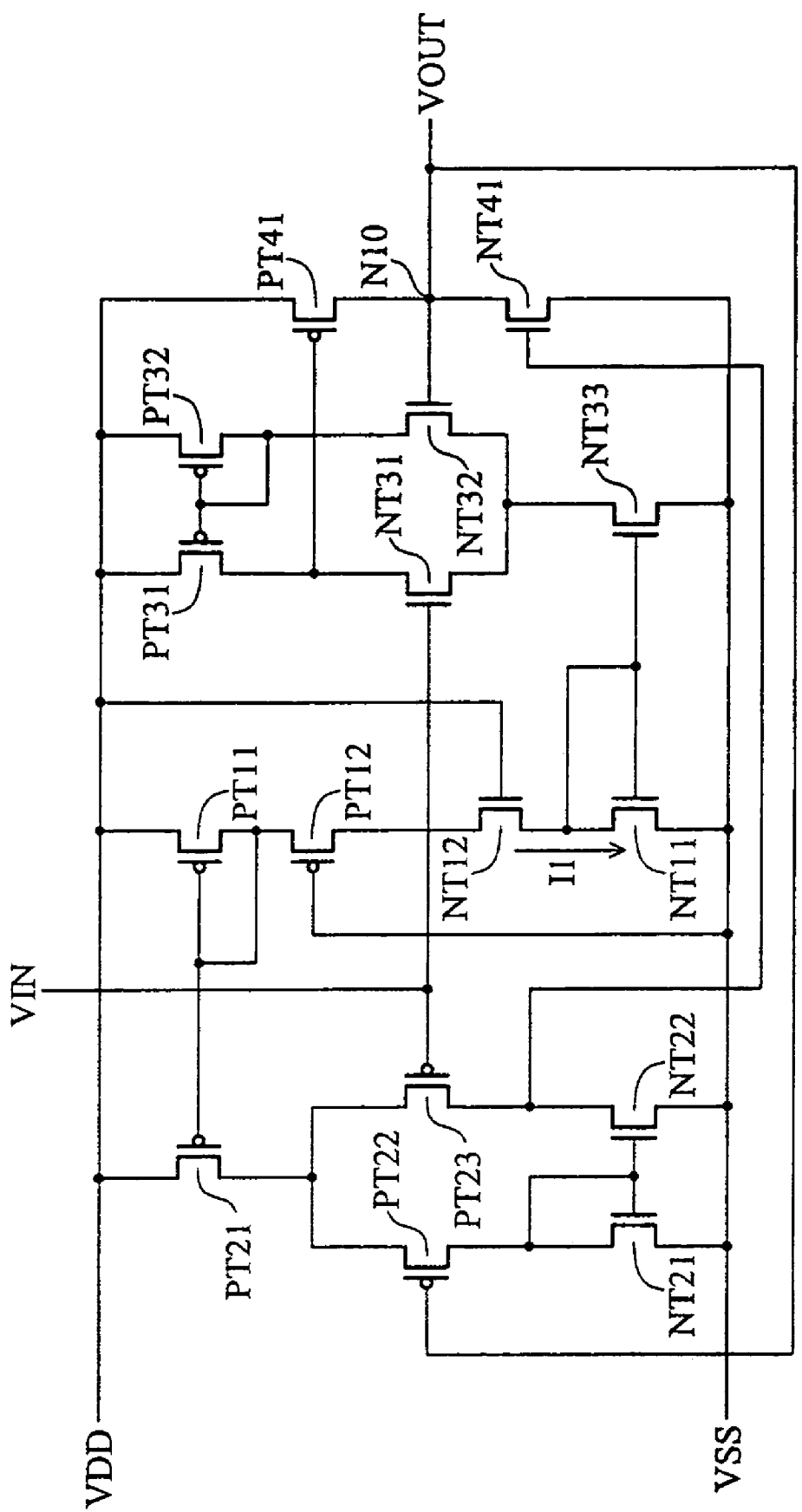
FIG. 8 is a circuit diagram showing another embodiment of the prior art analog buffer circuit.

FIG. 3 is a circuit diagram showing another embodiment of the invention applied to the conventional analog buffer circuit described in FIG. 8. In this figure, also, same reference numerals designate similar components to those in FIG. 1, and the details are omitted.

In FIG. 3, the difference from the circuits in FIG. 8 is that a reference current circuit of a P channel transistor PT51 for supplying constant current $I_{ref}$ is provided, and the current source circuit (in FIG. 8) is replaced with a current mirror of a transistor PT11 and a source-grounded amplifier NT11. In addition, a current mirror of a transistor PT42 is additionally provided to the downstream side of the inverter (comprising the transistors PT41 and NT41).

Furthermore, a switch SW2 is provided between a drain of the transistor PT42 and a connection node N11, a switch SW3 is provided between a connection node N10 to a gate of a transistor NT32 and the transistor PT41 and a connection node N11, a switch SW1 is provided between the connection node N10 and the transistor NT41 having its source grounded to $V_{SS}$, and a switch SW4 is provided between the connection node N11 and an output terminal $V_{OUT}$. The gate of the transistor NT41, with a grounded source, is connected to a gate of the current mirror transistor NT11.

The circuit configured as mentioned above (in FIG. 3) is activated in the following manner. In the standby mode, the switches SW1 and SW2 are turned on, and the switches SW3 and SW4 are turned off. This permits minute reference current to flow through the current mirrors of the transistors PT22, NT22, PT42 to initialize all the connection nodes in the circuit.

Then, by turning the switches SW1 and SW2 off, and turning the switches SW3 and SW4 on, the standby mode is shifted to the active mode, and an inverting amplification is performed by the three stages of the amplification transistors NT11, NT41, NT42 depending upon an input signal from $V_{IN}$. Based on this circuit configuration, the current mirrors supply currents without the current source circuit in which high current flows, and thus, the power consumption, as a whole, can be reduced.

In addition, since there is no current source circuit of four transistors connected in series unlike the conventional art, the circuit, even if fabricated using the LTPS process, does not encounter uneven power consumption due to the varied turn-on resistance from one transistor to another resulting from the manufacturing process.

Figure 4:
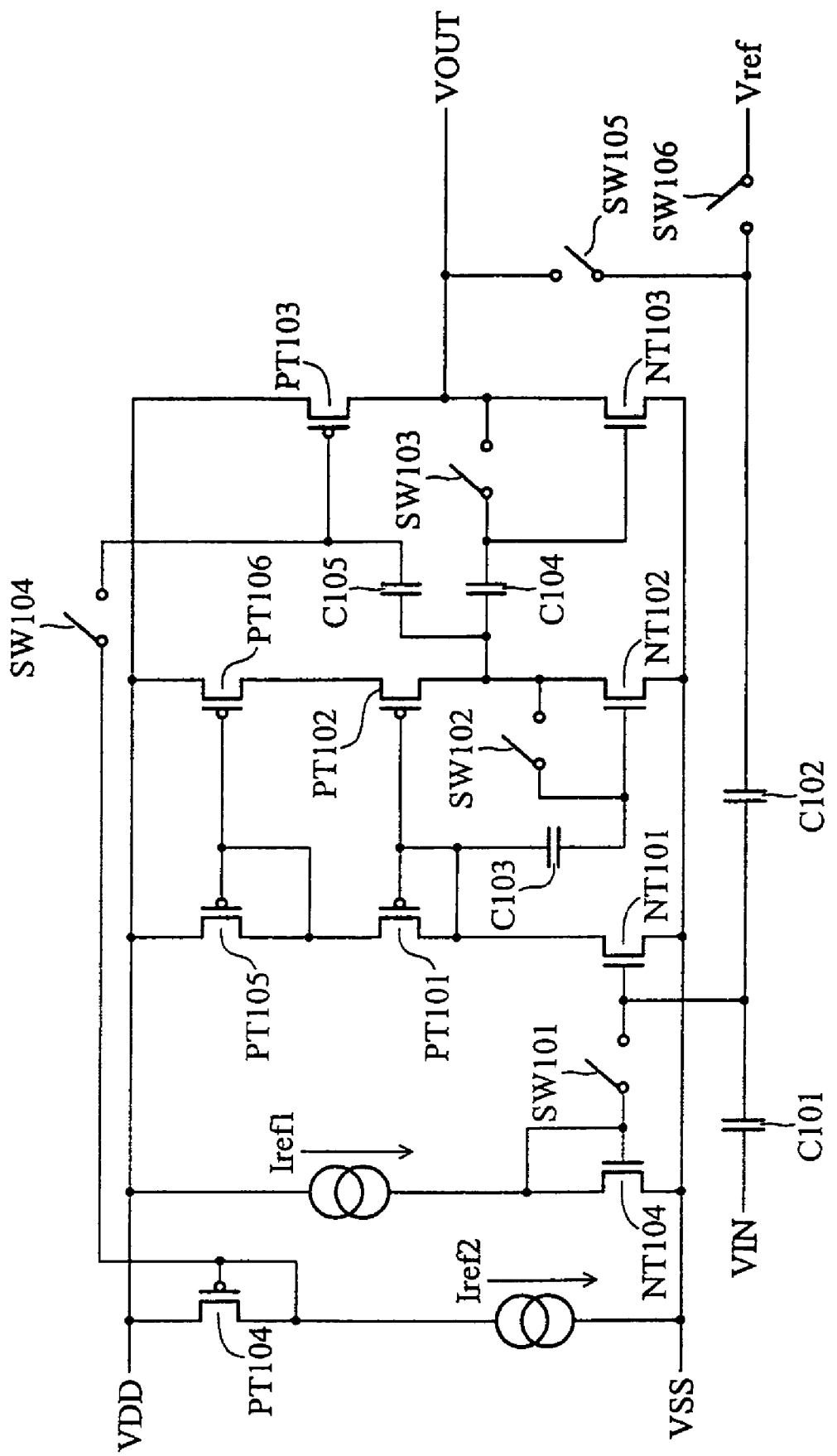
FIG. 4 is a circuit diagram illustrating another embodiment of the analog buffer circuit of the present invention.

FIG. 4 is a circuit diagram showing another embodiment of the analog buffer according to the invention, and this embodiment is another variation of the one shown in FIG. 1.

This circuit, similar to the embodiment shown in FIG. 1, comprises three-stage source-grounded amplification transistors NT101, NT102 and NT103, which are respectively coupled to one another via capacitors C103 and C104. The circuit also comprises two reference current sources made up of transistors NT104 and PT104 respectively, and the transistor NT104 as one of the current source may have a connected source to $V_{SS}$ and gate and drain connected to each other to supply first reference current $I_{ref1}$, while the transistor PT104 as the other current source may have a connected source to supply voltage $V_{DD}$ and gate and drain connected to each other to supply second reference current $I_{ref2}$.

The gate of the transistor NT104 is connected to a gate of the transistor NT101 as the first stage amplifier via a switch SW101, and when the switch SW1 is moved to a closed position (or is turned on), the transistors NT104 and NT101 function as current mirrors. A load transistor PT101, having a drain connected to a drain of the transistor NT101, may have a connected source to a drain of a transistor PT105 which may have a connected source to supply voltage $V_{DD}$ and its gate connected to its drain. A transistor PT106, having a gate connected to the gate of the transistor PT105 and a source connected to the supply voltage $V_{DD}$, makes up a current mirror along with the transistor PT105 and has a drain connected to a source of a transistor PT102 which has a gate connected to a gate of the transistor PT101 and a drain of PT102 is connected to a drain of a transistor NT102 serving as a second stage amplifier. A second switch SW102 is connected between the gate and the drain of the transistor NT102.

The drain of transistor NT102 is connected to capacitors C104 and C105, and the opposite end of the capacitor C104 is connected to a gate of the transistor NT103 and the output terminal $V_{OUT}$ via a switch SW103. The opposite end of capacitor C105 is connected to the gate of the transistor PT103 and the gate of the transistor PT104 via a switch 104. The transistor PT103 may have a connected source to the supply voltage $V_{DD}$.

An input $V_{IN}$ is connected to the gate of the transistor NT101 via the capacitor C101. The gate of the transistor NT101 is also connected to reference voltage $V_{ref}$ via the capacitor C102 and a switch SW106 and further to the output terminal $V_{OUT}$ via a switch SW105.

Operation of the circuit in FIG. 4 will be described.

In the standby mode, the switches SW101, SW102, SW103, SW104 and SW106 are turned on, and the switch SW105 is turned off. The arrangement allows the reference current $I_{ref2}$ and the reference current $I_{ref1}$ to respectively flow into the transistors PT103 and NT101 serving as the current mirrors, and thus, reduces power consumption.

In the active mode, the switches SW101, SW102, SW103, SW104, and SW106 are turned off, and the switch SW105 is turned on. The arrangement allows the input signal to be inverted through three stages of the inverting amplifiers and a negative feedback path of the capacitors C101 and C102 to produce an output. During the operation, shifting the switch SW104 to the opening position (turned off state) causes the transistor PT103 in the last stage to perform amplification, and hence, enhances drive ability.

Stability of the buffer circuit will now be contemplated.

Figure 5:
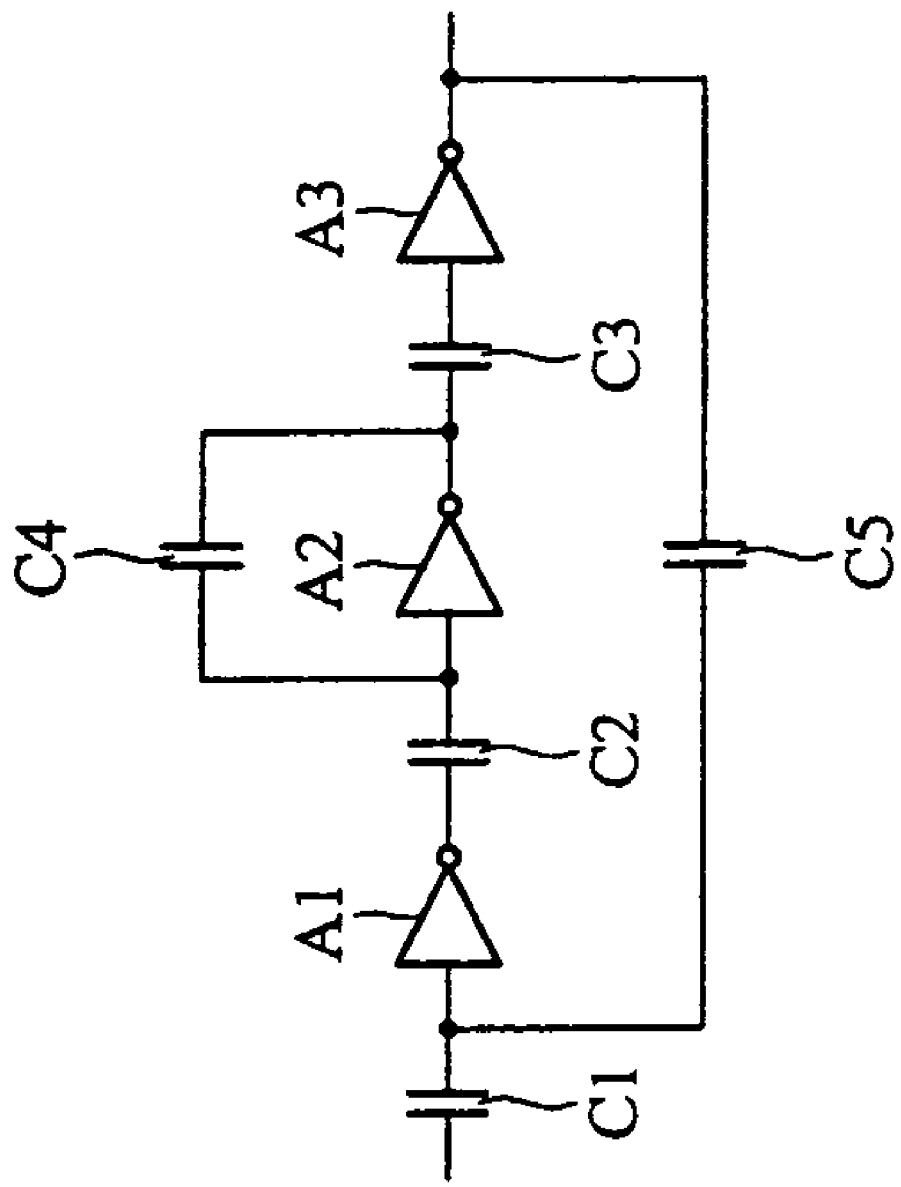
FIG. 5 is a schematic circuit diagram showing the prior art buffer circuit.

FIG. 5 schematically depicts conventional buffer circuit built up through capacitive coupling, wherein the buffer circuit comprises three stages of inverting amplifiers A1, A2 and A3, and three capacitors C1, C2 and C3 respectively disposed before each of the inverting amplifiers A1, A2 and A3.

Typically, the buffer circuit is provided with a negative feedback (NFB) path to stabilize operations, and as can be seen in FIG. 5, a feedback path with a capacitor C5 leads from the output of the inverting amplifier A3 toward the input of the inverting amplifier A1. The inverting amplifier A2 in the intermediate stage has a capacitor C4 as a mirror capacitor connecting between the input and output thereof for the purpose of phase compensation.

The circuit configured in the aforementioned manner may not have sufficient phase margin. The phase margin may be reduced to as low as 22°, for example.

Generally, phase margin must be 45° or greater to ensure operating stability, and insufficient phase margin may cause ringing and oscillation. Phase margin of 22 is a considerably small value at which the circuit allows poor operational stability, thus likely resulting in oscillation and ringing in a transient characteristic waveform.

Figure 6:
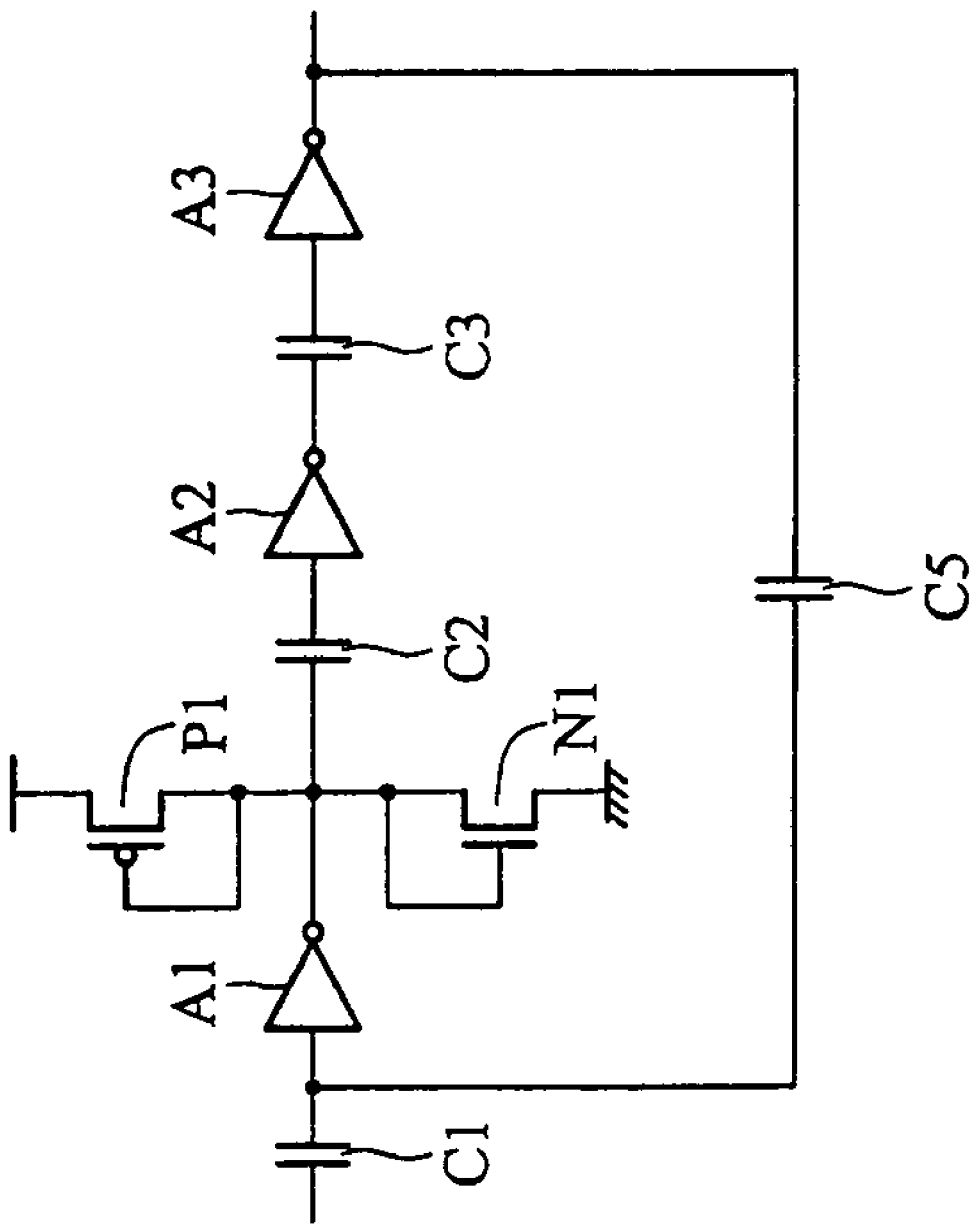
FIG. 6 is a schematic circuit diagram showing a configuration from which the defects observed in the embodiment in FIG. 5 are eliminated.

To cope with this issue, as shown in FIG. 6, the conventional phase compensation capacitor C4 is eliminated, and a PMOS transistor P1 and an NMOS transistor N1 having their respective drains and gates connected together are provided in connection with the output of the inverting amplifier A1 in the first stage.

In this method, impedance at the output of the inverting amplifier in the first stage can be reduced, the phase margin is kept at 60° or above, and circuit stability can be considerably improved.

Connecting the PMOS and NMOS transistors to an output of the amplifier in the first inverting stage is advantageous to enhance the circuit stability in this embodiment of the invention, as well as in the aforementioned ones.

In the embodiments of the invention described so far, there are three signal inverting units, and preferably, the units are implemented in an application of the present invention having three or more odd number of stages. Specifically, the "odd number" stages are required by a prerequisite condition that a negative feedback path is provided. Additionally, a single inverting stage is not preferred due to the possibility for a lack of gain, resulting in insufficient accuracy of the output voltage, and insufficient driving ability. In contrast, too many inverting stages cause adverse effects such as too high gain and phase retardation in the inverting unit, and hence three stages of the inverting unit balance both of gain and stability. The preferred embodiment of the invention should not be limited to the precise form, but other applications having several other odd numbers of the stages of the inverting amplifiers can be contemplated. Also, part of the amplifier in the final stage does not necessarily have to carry out the current mirror operation upon shifting of the switch to the standby mode, but can optionally function as a member of the inverting amplifier in the active mode.

Although a current value at the reference current source is kept constant for the aforementioned embodiments of the invention, the circuit designer can chose a low current setting where the power distribution is concentrated on a reduction of the power consumption during the standby mode rather than high drivability during the active mode, or can chose a high current setting where an increase in the drivability during the active mode is a good tradeoff with a moderate reduction of the power consumption during the standby mode. Both settings can be preprogrammed.

What is claimed is:

1. A buffer circuit, comprising
an odd number of inverting amplifying stages, wherein the stages are capacitive coupled;
a negative feedback path feeding back from an output terminal of a final stage of the inverting amplifying stages to an input terminal of an initial stage of the inverting amplifying stages;
at least a reference current source;
a first switch provided between any two adjacent stages of the inverting amplifying stages, wherein the first switch is switched depending upon a mode of operation; and
a second switch capable of connecting the reference current source to at least a transistor in the final stage to selectively configure a current mirror circuit, depending upon a mode of operation.

2. The buffer circuit according to claim 1, wherein the inverting amplifying stages are source-grounded amplifiers.

3. The buffer circuit according to claim 1, further comprising an operational amplifier respectively provided before each of the inverting amplifying stages.

4. The buffer circuit according to claim 1, wherein each of the inverting amplifying stages comprises an amplifying element and an active load element, and the active load element builds up the current mirror circuit with the reference current source during a standby mode in response to operation of a second switch, and the active load element serves as an amplifier for the amplifying element during an active mode.

5. The buffer circuit according to claim 1, further comprising a P channel MOS transistor and an N channel MOS transistor, wherein the P channel MOS transistor and the N channel MOS transistor have respective gates and drains connected to an input node of an intermediate stage of the inverting amplifying stages and respective sources connected to a reference potential.

6. The buffer circuit according to claim 5, wherein the reference current source comprises separate dedicated reference current sources respectively dedicated to the P channel MOS transistor and the N channel MOS transistor.

* * * * *